(12) United States Patent
Richardson

(10) Patent No.: US 9,510,458 B2
(45) Date of Patent: Nov. 29, 2016

(54) HIGH ASPECT RATIO TRACES, CIRCUITS, AND METHODS FOR MANUFACTURING AND USING THE SAME

(71) Applicant: Brian Edward Richardson, Los Gatos, CA (US)

(72) Inventor: Brian Edward Richardson, Los Gatos, CA (US)

(73) Assignee: Imagine TF, LLC, Los Gatos, CA (US)

( * ) Notice: Subject to any disclaimer, the term of this patent is extended or adjusted under 35 U.S.C. 154(b) by 244 days.

(21) Appl. No.: 14/207,405

(22) Filed: Mar. 12, 2014

(65) Prior Publication Data

US 2014/0262456 A1    Sep. 18, 2014

Related U.S. Application Data

(60) Provisional application No. 61/851,967, filed on Mar. 13, 2013.

(51) Int. Cl.
| | |
|---|---|
| *H05K 3/10* | (2006.01) |
| *H05K 3/12* | (2006.01) |
| *H05K 1/02* | (2006.01) |
| *H05K 1/11* | (2006.01) |

(52) U.S. Cl.
CPC .......... *H05K 3/1258* (2013.01); *H05K 1/0289* (2013.01); *H05K 1/119* (2013.01); *H05K 2201/0108* (2013.01); *Y10T 29/49165* (2015.01)

(58) Field of Classification Search
CPC ..................................................... H05K 3/107
See application file for complete search history.

(56) References Cited

U.S. PATENT DOCUMENTS 8,120,070 B2 * 2/2012 Nakazato et al. ............ 257/244

* cited by examiner

*Primary Examiner* — Jeremy C Norris
(74) *Attorney, Agent, or Firm* — Carr & Ferrell LLP

(57) ABSTRACT

High aspect ratio trace circuits and methods of manufacture and use are provided herein. A method may include obtaining a substrate, the substrate having a reservoir for receiving a conductive ink and a plurality of trace voids that are arranged in a pattern, the plurality of trace voids each having a path of fluid connection to the reservoir, filling the reservoir with a conductive ink, placing a cover film over the plurality of trace voids, allowing the conductive ink to fill the plurality of trace voids via capillary action to create a plurality of conductive traces, and allowing the conductive ink in the plurality of conductive traces to dry.

55 Claims, 13 Drawing Sheets

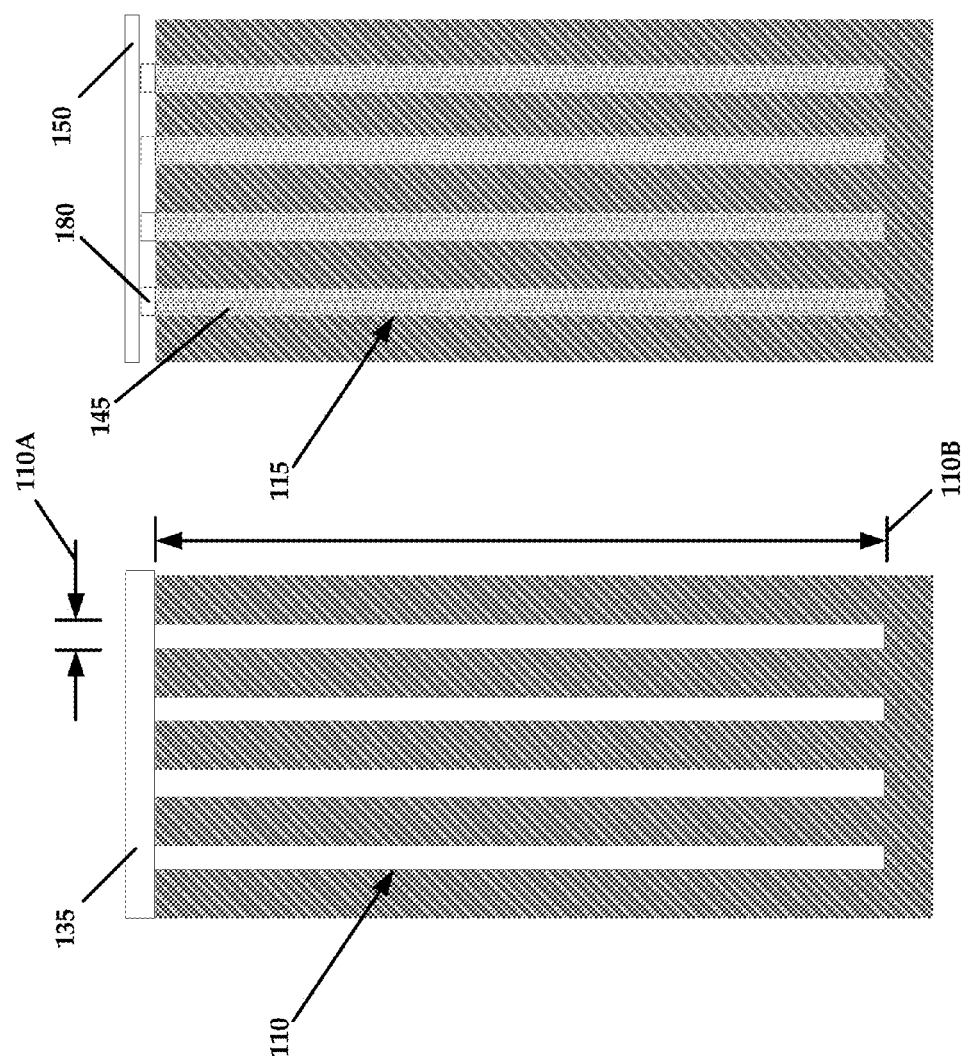

HIGH ASPECT RATIO TRACES, CIRCUITS, AND METHODS FOR MANUFACTURING AND USING THE SAME

CROSS-REFERENCE TO RELATED APPLICATIONS

This non-provisional U.S. patent application claims the priority benefit of U.S. Provisional Application Ser. No. 61/851,967, filed on Mar. 13, 2013, titled "Capillary Traces", which is hereby incorporated herein by reference in its entirety including all references cited therein.

FIELD OF THE INVENTION

The present technology is directed generally to circuit and circuit manufacturing methods, and more specifically, but not by way of limitation, to circuits with high aspect ratio traces created using manufacturing methods that employ conductive ink and leverage capillary action to create traces with the conductive ink.

SUMMARY OF THE PRESENT TECHNOLOGY

According to some embodiments, the present technology may be directed to a capillary trace circuit manufactured by a method, the method comprising: (a) obtaining a substrate, the substrate having a reservoir for receiving a conductive ink and a plurality of trace voids that are arranged in a pattern, the plurality of trace voids each having a path of fluid connection to the reservoir; (b) filling the reservoir with a conductive ink; (c) placing a cover film over the plurality of trace voids; (d) allowing the conductive ink to fill the plurality of trace voids via capillary action to create a plurality of conductive traces; and (e) allowing the conductive ink in the plurality of conductive traces to dry.

According to some embodiments, the present technology is directed to a circuit, comprising: a substrate having a plurality of trace voids that are arranged in a pattern, each of the plurality of trace voids having a high aspect height to width ratio of as much as 10:1, with an average ratio of 5:1; a plurality of pad voids joined to the plurality of trace voids, wherein the plurality of trace voids are filled with a conductive ink via capillary action to form a plurality of conductive traces.

BRIEF DESCRIPTION OF THE DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to the particular embodiments illustrated herein.

FIGS. 1A-1D are a perspective view of an exemplary substrate for manufacturing circuits with high aspect ratio traces, formed via capillary action.

DESCRIPTION OF EXEMPLARY EMBODIMENTS

Figure 1A:
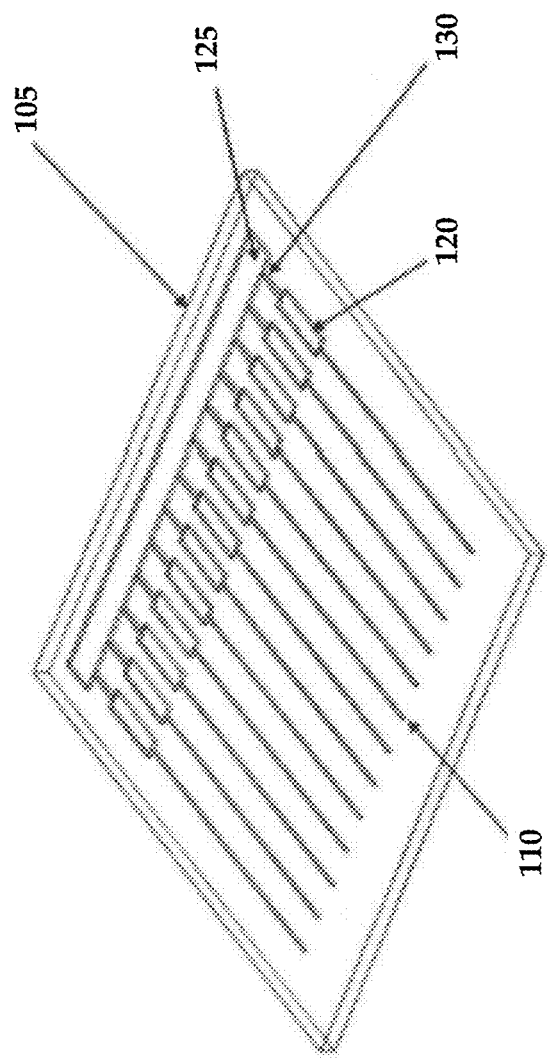

In the following description, for purposes of explanation, numerous specific details are set forth in order to provide a thorough understanding of the disclosure. It will be apparent, however, to one skilled in the art, that the disclosure may be practiced without these specific details. In other instances, structures and devices are shown at block diagram form only in order to avoid obscuring the disclosure.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Software") may be interchangeably used with its non-capitalized version (e.g., "software"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is noted at the outset that the terms "coupled," "connected," "connecting," "electrically connected," etc., are used interchangeably herein to generally refer to the condition of being electrically/electronically connected. Similarly, a first entity is considered to be in "communication" with a second entity (or entities) when the first entity electrically sends and/or receives (whether through wireline or wireless means) information signals (whether containing data information or non-data/control information) to the second entity regardless of the type (analog or digital) of those signals. It is further noted that various figures (including component diagrams) shown and discussed herein are for illustrative purpose only, and are not drawn to scale.

Figure 2:
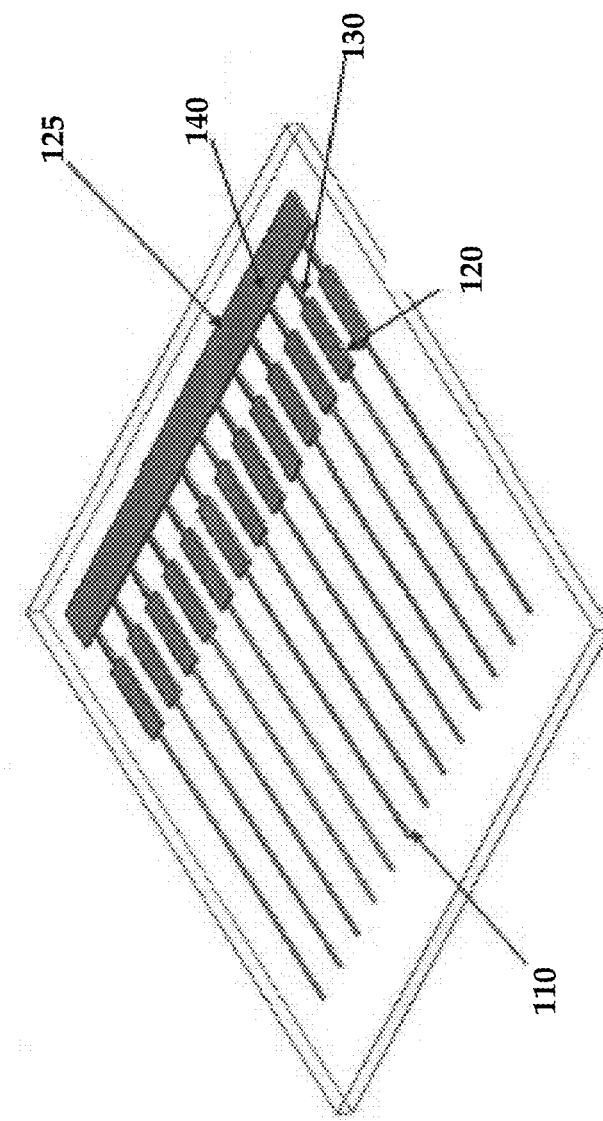
FIG. 2 is a perspective view of the substrate of FIG. 1, with conductive ink disposed in a reservoir of the substrate, a conductive ink filling various voids of the substrate.

FIG. 1A is a perspective view of an exemplary substrate for manufacturing circuits with high aspect ratio traces, formed via capillary action as show in FIG. 2. The substrate 105 is formed from a sheet of material such as a plastic, polymer, and/or resin, in some instances. The substrate may be formed of other materials suitable for use as an electrical circuit design, as one of ordinary skill in the art would appreciate.

In some embodiments, the substrate 105 is manufactured by forming various features onto the surface of a substantially flat sheet of material. Various methods of forming can be used such as embossing, ultraviolet curing, ink-jet printing, silk-screening, vacuum deposition, or combinations thereof. These various methods will function to place material onto a film to form the substrate 105.

Other methods for forming voids in a substrate may depend on the material used as the substrate. For example, if the substrate is formed from a silicon wafer, the voids may be sintered or cut into the silicon wafer.

The features of the substrate may at least include a plurality of trace voids such as trace void 110. A trace void may be formed from as a groove of relatively thin width as compared to its height. This configuration for the trace void is referred to as a high aspect ratio. In some embodiments, the aspect ratio of a trace void is at least approximately 10:1. A nominal average ratio may be 5:1, with a minimum of 3:1. For example, the trace void of FIG. 1B illustrates a trace void 110 having a width 110A of ten microns and a height 110E of 100 microns. These dimensions are merely exemplary and may vary according to circuit design requirements. A filled trace void 115 is illustrated in FIG. 1C. The filling of the trace voids will be discussed in greater detail below.

Because of the high aspect ratio of the traces of the substrate, circuits manufactured using these substrates have conductive traces that can be placed in close proximity to one another, creating circuits with high trace yields (e.g., a large number of traces per circuit width).

With many semiconductor devices it is desirable to have at least a portion of the traces of a circuit with a substantial cross sectional area. An example of these types of traces is power input or ground traces. Capillary traces can be created in silicon to serve this function, rather than plastic or other substrate materials.

Turning back to FIG. 1A, the substrate 105 is also provided with one or more pad voids, such as pad void 120, that are in fluid communication with at least a portion of the plurality of trace voids 110. The substrate 105 also includes a reservoir 125 that is in fluid communication with the one or more pad voids 120 by way of one or more optional channel voids 130. The optional channel voids 130 are in fluid communication with the one or more pad voids 120 and the reservoir 125.

In some embodiments, the reservoir 125 is filled with a conductive ink 140, as illustrated in FIG. 2. The reservoir 125 may be filled with an amount of conductive ink that is sufficient to fill the trace voids 110 and pad voids 120.

Figure 1D:
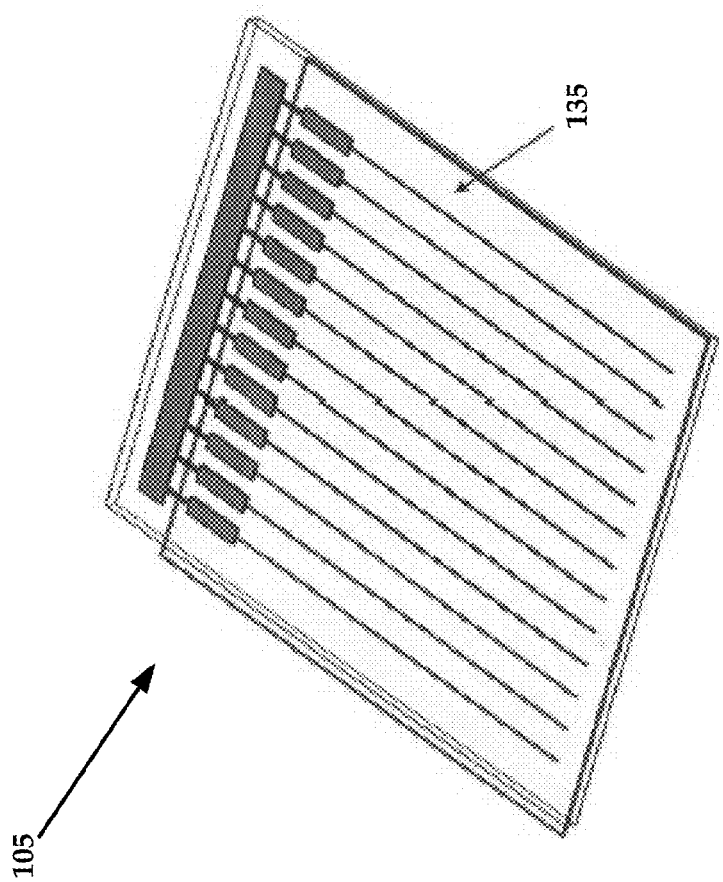

The substrate 105 is also provided with a cover film 135 over the plurality of trace voids 110 as shown in FIG. 1B and FIG. 1D. The cover film 135 may cover at least the trace voids 110 but may also cover the pad voids 120 as well as the optional channel voids 130. The placement of the cover film 135 over the substrate 105 functions to enclose the various voids formed in the substrate 105. When the voids are covered and conductive ink is disposed in the reservoir 125, the conductive ink is drawn into the voids via capillary action. For example, conductive ink in the reservoir 125 is drawn by capillary action through the optional channel voids 130, into the pad voids 120, and ultimately into the trace voids 110.

For context, capillary action (also referred to as capillary motion or wicking) is the ability for fluids to ascend or traverse upwardly through a relatively thin void, such as a slim tube, cylinder or permeable substance due to adhesive and cohesive forces interacting between the fluid and the surface. This movement of the fluid due to capillary action may overcome even gravitational forces that exert downwardly on the fluid. Explicit details regarding capillary action will be omitted for brevity, but it will generally be understood that three factors affect the ability of a fluid to travel via capillary action.

First, a cohesive force is present, which refers to the intermolecular bonding of the substrate substance where its mutual attractiveness forces molecules of the substance to maintain a certain shape of the fluid, such as the shape of the void. Additionally, surface tension occurs as a result of like molecules, cohesive forces, banding together to form a somewhat impenetrable surface on the outer surface of the fluid. Finally, adhesive force is present when forces of attraction between unlike molecules occur, such as between the molecules of the substrate and the molecules of the conductive ink.

It will be appreciated that voids, and specifically, the trace voids of the substrate 105 have a cross sectional area that facilitates capillary action therein, so as to draw the conductive ink upwardly within the voids.

The conductive ink may have any particular composition that supports capillary action. Thus, the conductive ink that is chosen should preferably interact with the molecules of the substrate material to ensure that capillary action occurs when the conductive ink is placed into the substrate reservoir. Thus, various permutations of substrate materials and conductive ink composition may be used so long as capillary action can be facilitated using the selected materials.

According to some embodiments, rather than (or in addition to) relying on capillary action the conductive ink 140 may be forced into the voids of the substrate by applying a pressure force to the conductive ink so as to force the conductive ink into the plurality of trace voids. For example, the reservoir 125 (and the remaining voids of the substrate) may be sealed and conductive ink can be pumped into the reservoir at a given pressure.

Figure 3:
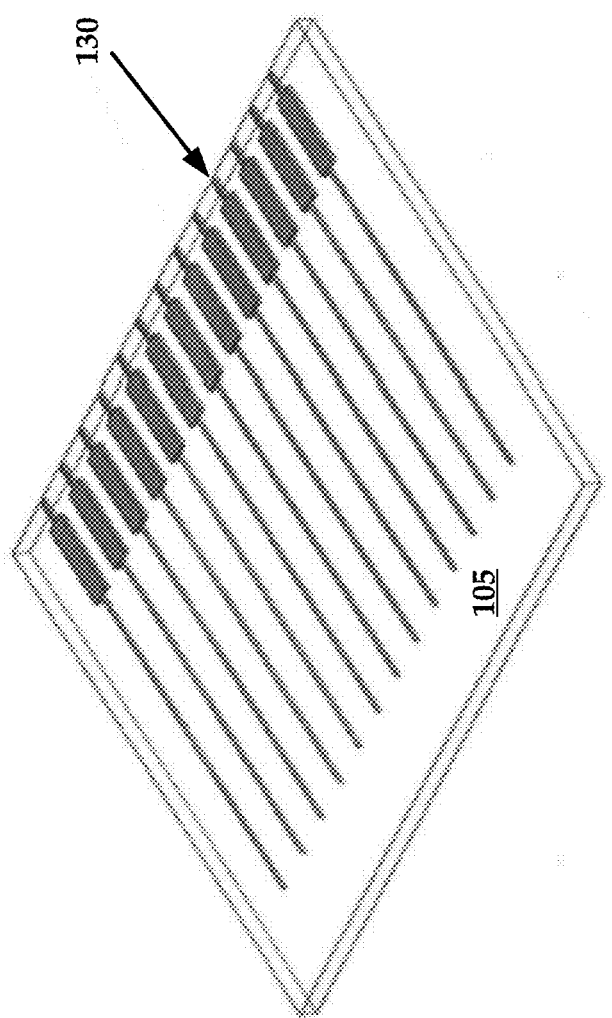
FIG. 3 is a perspective view of the filled substrate of FIG. 2, where the reservoir has been trimmed from the filled substrate.

In some instances, after the conductive ink 140 has dried within the substrate 105, the reservoir 125 is trimmed off. A portion of the optional channel voids 130 is also trimmed, as illustrated in FIG. 3.

Figure 4:
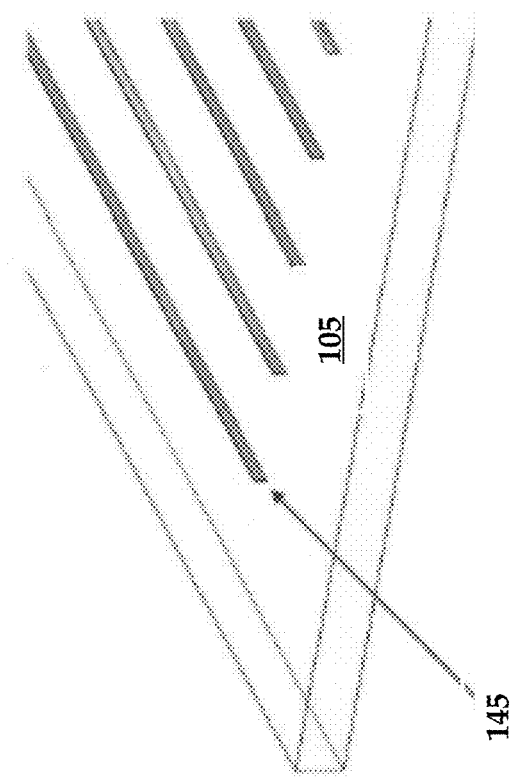
FIG. 4 is a partial perspective view of traces of the substrate of FIG. 1.

FIG. 4 is a partial perspective view of traces of the substrate of FIG. 1A. Each of the trace voids has been filled with the conductive ink to form conductive traces, such as conductive trace 145. The conductive trace 145 is also illustrated in FIG. 1C. A substrate having voids that have been filled with conductive ink are hereinafter referred to as a "circuit" or "capillary trace circuit."

In some embodiments, substrate 105 includes a protective film layer 150 on to the capillary trace circuit (e.g., substrate and filled voids) that covers the plurality of conductive traces 145. The protective film layer 150 includes any of a semi-transparent coating of tin-doped indium oxide (ITO), copper nanowires, silver nanowires, and combinations thereof.

In additional embodiments, a layer of electroplating 180 may be applied to a top surface of each of the plurality of conductive traces, such as conductive trace 145, to increase a height of each of the plurality of conductive traces.

Figure 5:
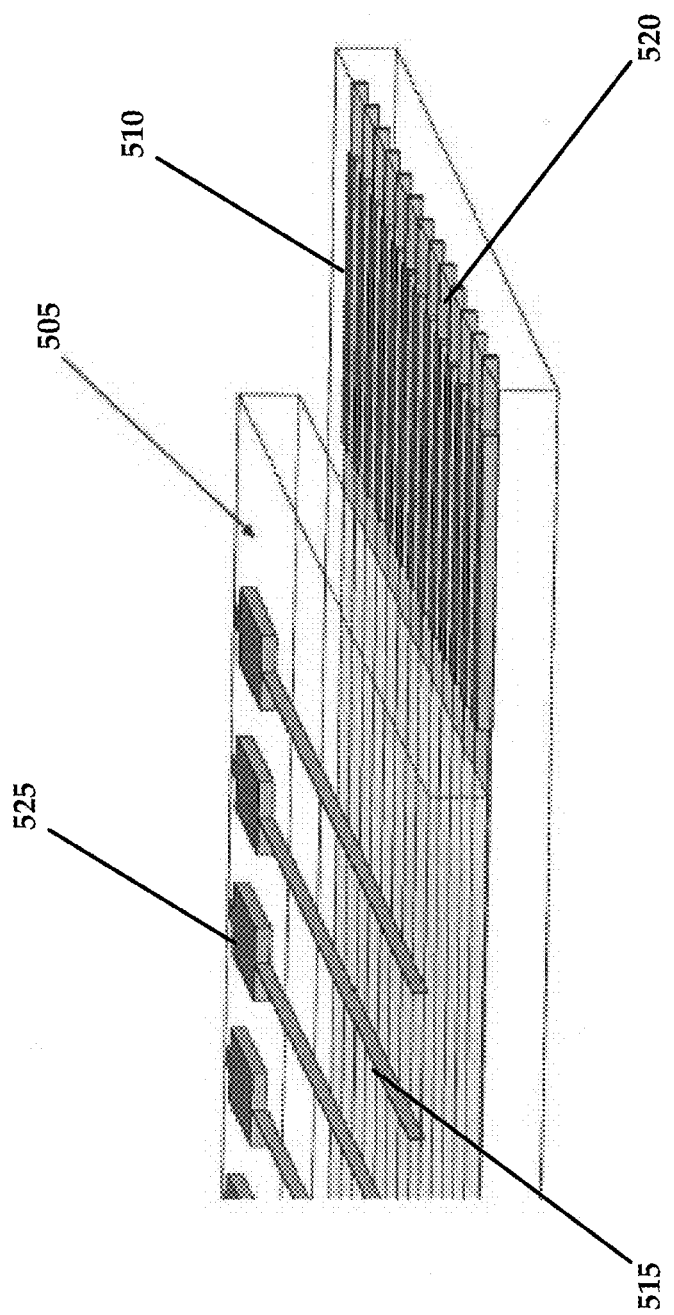
FIG. 5 is a partial perspective view of two circuits that are disposed orthogonally to one another.
Figure 6:
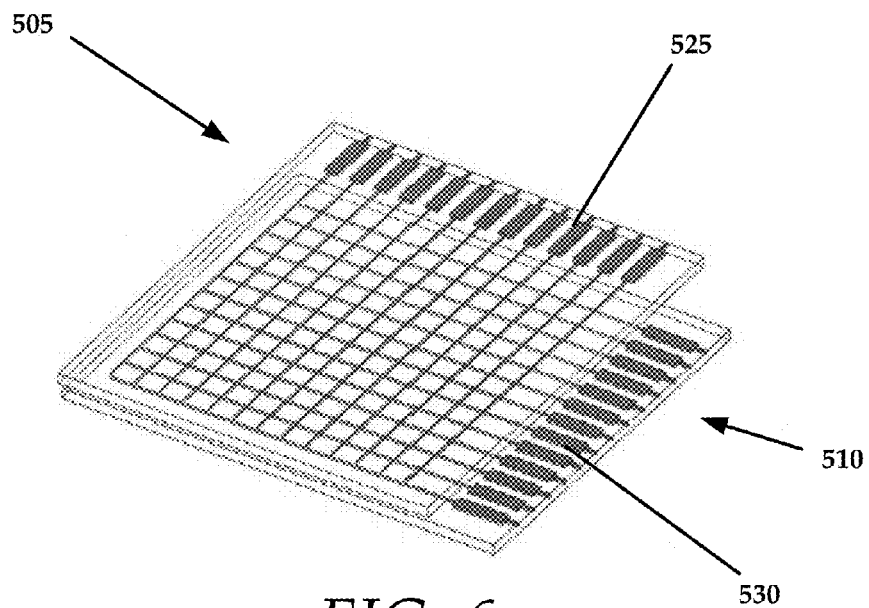
FIG. 6 is a perspective view of the two circuits of FIG. 5.

FIG. 5 is a partial perspective view of two circuits 505 and 510 that are disposed orthogonally to one another. More specifically, circuits 505 and 510 are manufactured as described above and are capable of being stacked in a variety of different configurations. In the embodiment of FIG. 5, the conductive traces 515 of circuit 505 are placed orthogonally to the conductive traces 520 of circuit 510. The circuits may be offset from one another to allow the conductive pads (such as conductive pads 525 of circuit 505) of both circuits to be exposed. FIG. 6 is a perspective view of the two circuits of FIG. 5 showing the conductive pads 525 of circuit 505 and conductive pads 530 of circuit 510.

Figure 7:
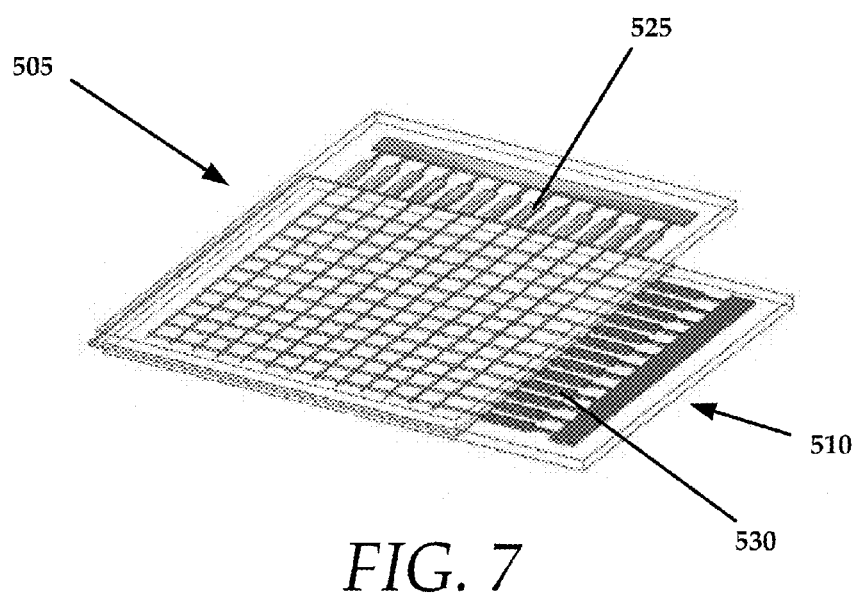
FIG. 7 is a perspective view of the two circuits of FIG. 5, where the traces are placed in face-to-face relationship to one another.

FIG. 7 is a perspective view of the two circuits of FIG. 5, where the conductive traces of the circuits are placed in face-to-face relationship to one another. That is, the conductive pads 525 of the top circuit 505 are disposed downwardly while the conductive pads 530 of the bottom circuit 510 are disposed upwardly. It will be understood that circuits of the present technology can be stacked such that the conductive traces are linearly aligned, orthogonal, or angled relative to one another. Further, circuits of the present technology can be stacked in any number.

Figure 8:
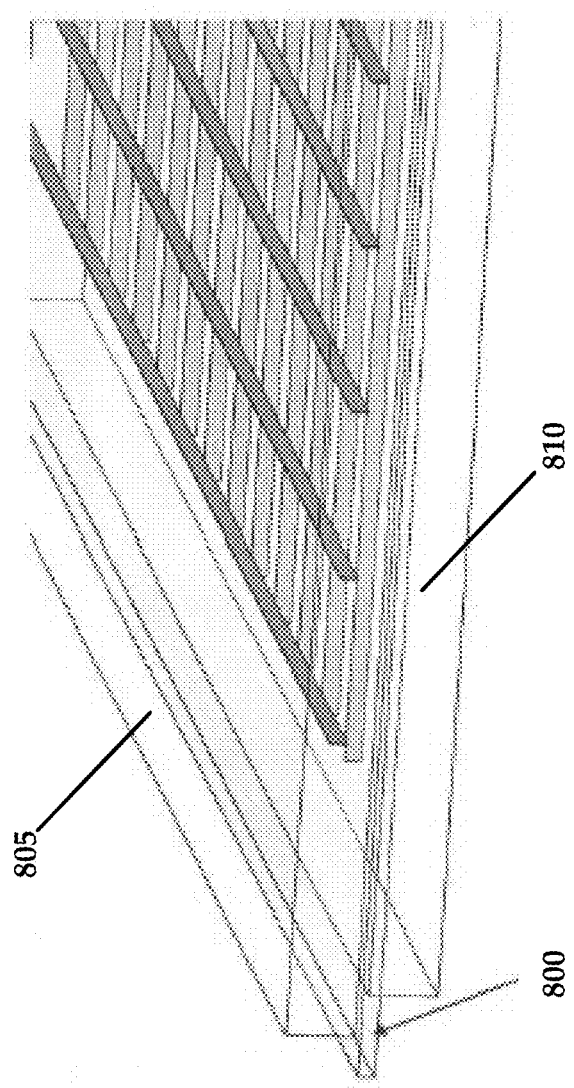
FIG. 8 is a partial perspective view of FIG. 7 illustrating a transparent film layer disposed between the two circuits.
Figure 9:
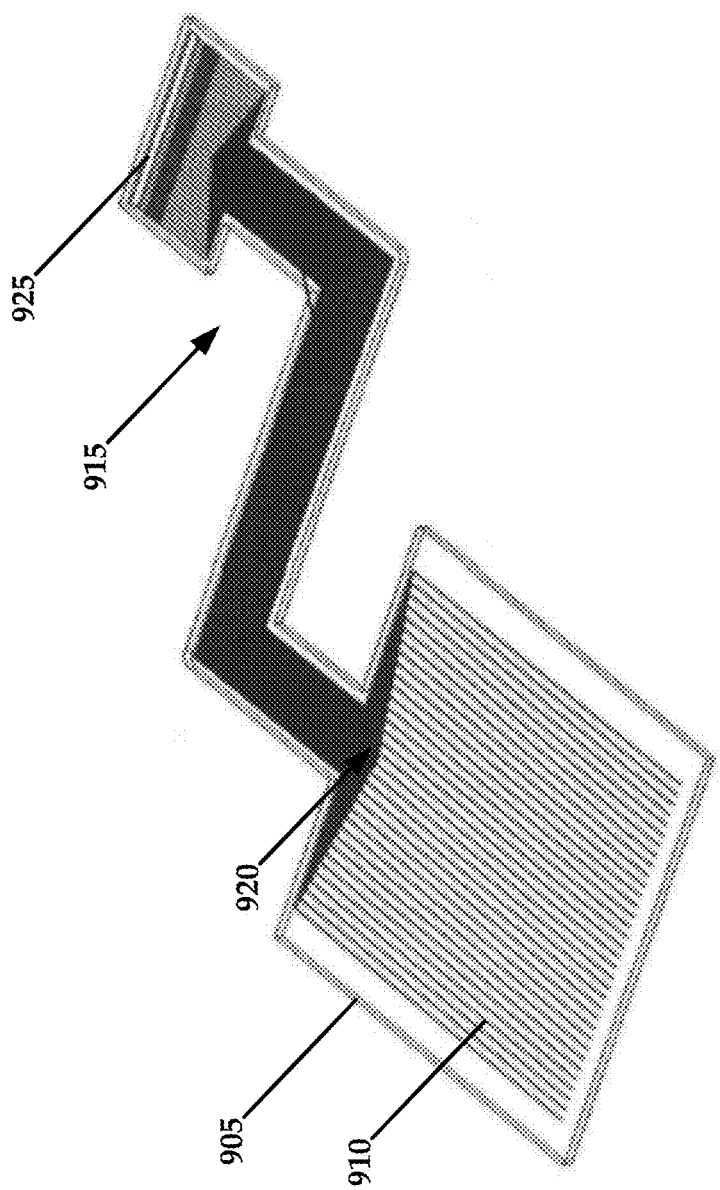
FIG. 9 is a perspective view of the circuit of FIG. 2 having a protective film layer applied over trace voids of the substrate.

FIG. 8 is a partial perspective view of FIG. 7 illustrating a transparent film layer 800 disposed between the two circuits 805 and 810. The conductive traces of the circuits are illustrated as extending orthogonally (e.g., perpendicularly) to one another FIG. 9 is a perspective view of a circuit 905 of the present technology coupled to a flex circuit interface 915. In this example, the circuit 905 includes only a plurality of conductive traces 910 that are each connected to the flex circuit interface 915. Other physical interfaces can be coupled to circuits of the present technology in similar manners. For example, a strip interface 920 may be applied to the conductive traces 910 to facilitate electrical connectivity with a terminal end 925 of the flex circuit interface 915.

Figure 10:
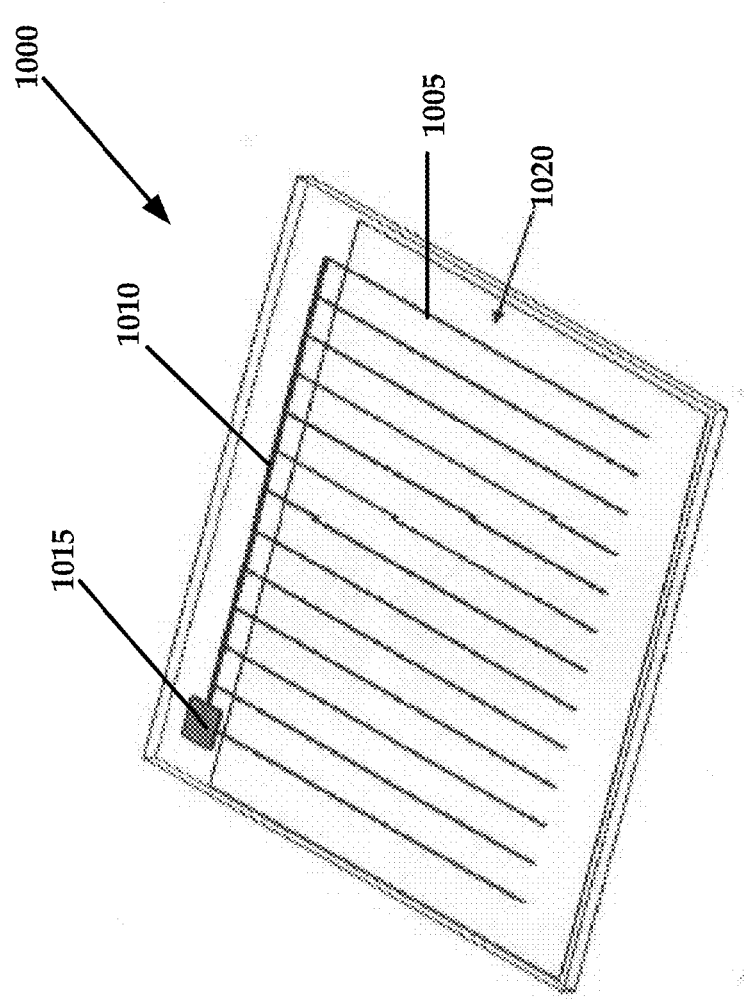
FIG. 10 is a perspective view of a circuit of the present technology coupled to a flex circuit interface.

FIG. 10 is a perspective view of another exemplary circuit 1000, manufactured using the methods of the present technology. The circuit 1000 includes a plurality of conductive traces 1005 that are electrically coupled via a bus trace 1010 that is filled with the conductive ink. The circuit 1000 may include a conductive pad 1015 that is coupled to the bus trace 1010 and at least one of the conductive traces 1005. The circuit 1000 may include a protective coating 1020 that is applied to a major portion of each the conductive traces 1005. This circuit 1000 can be utilized as a conductive semi-transparent electrode that is used for OLEO and solar cells.

Figure 11:
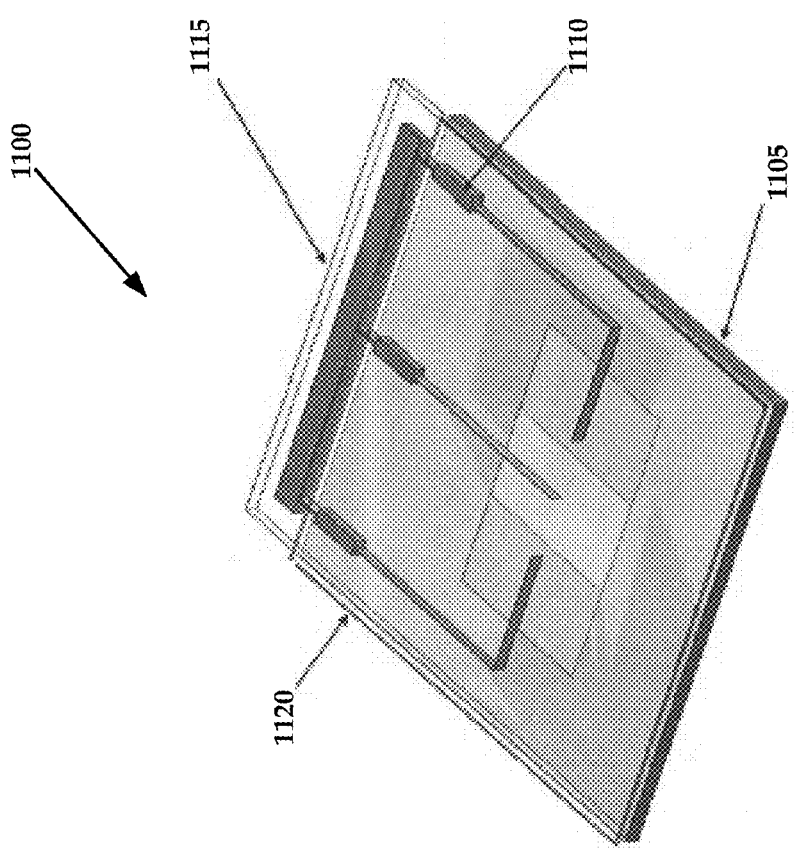
FIG. 11 is a perspective view of another exemplary circuit, manufactured using the methods of the present technology.

FIG. 11 is a perspective view of yet another exemplary circuit 1100, manufactured using the methods of the present technology. This circuit 1100 is manufactured having a silicon substrate 1105 with P and N areas (e.g., positive and neutral) that can couple to other needed electrical components. This circuit 1100 includes three capillary traces 1110 created using the aforementioned capillary action techniques to draw conductive ink into voids manufactured into the substrate.

The circuit 1100 may also include a silicon dioxide layer 1115 that is etched through at areas where a connection to other layers (above or below) is required. Other layers of the circuit 1100 can include insulators, for example. An optional protective cover layer 1120 is disposed on top of the circuit 1100.

Figure 12:
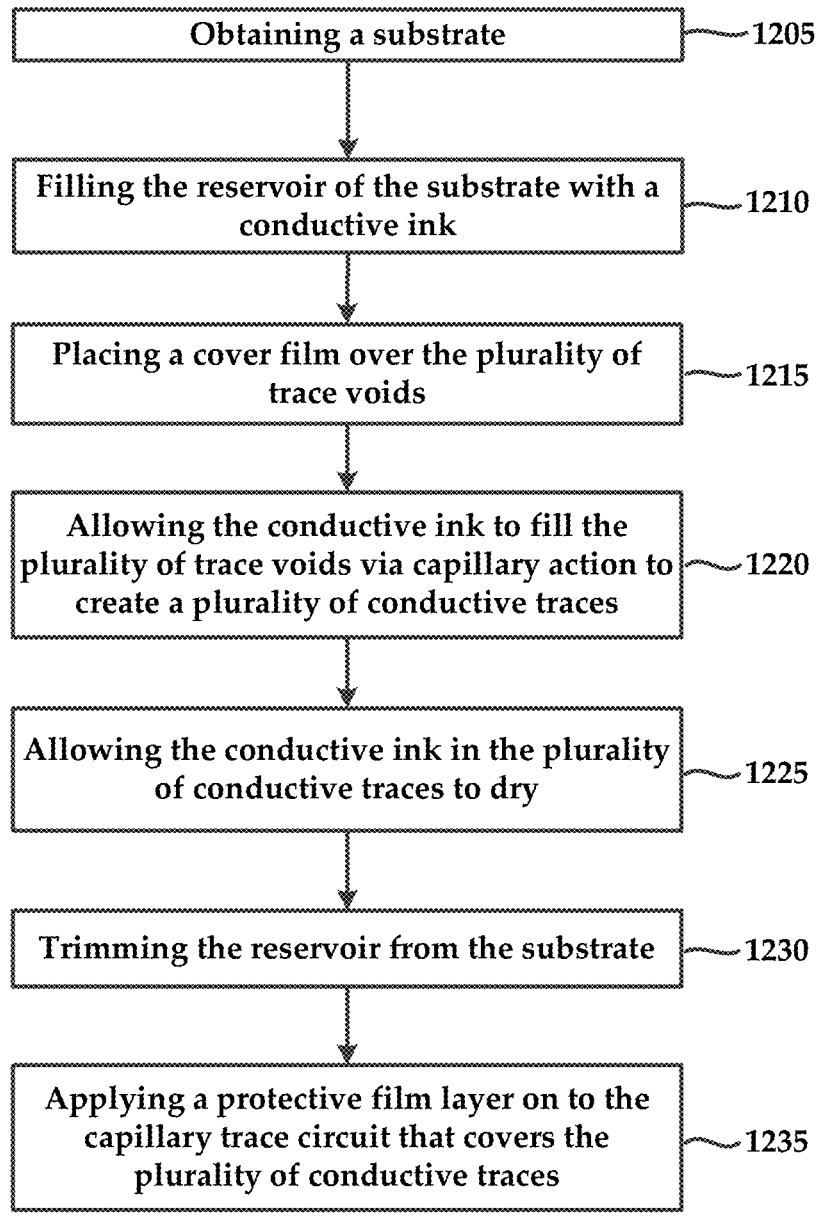
FIG. 12 is a perspective view of yet another exemplary circuit, manufactured using the methods of the present technology.

FIG. 12 is a flowchart of a method for manufacturing a capillary trace circuit. According to some embodiments, the method includes obtaining 1205 a substrate, such as any of the substrates above. In one embodiment the substrate has a reservoir for receiving a conductive ink and a plurality of trace voids that are arranged in a pattern on the substrate. It will be understood that the plurality of trace voids each have a path of fluid connection to the reservoir.

In some embodiments, the method includes filling 1210 the reservoir of the substrate with a conductive ink, and placing 1215 a cover film over the plurality of trace voids. It will be understood that the cover film may be placed over the trace voids prior to filling the reservoir with conductive ink.

Next, the method includes allowing 1220 the conductive ink to fill the plurality of trace voids via capillary action to create a plurality of conductive traces. Further, the method includes allowing 1225 the conductive ink in the plurality of conductive traces to dry. Once dried, the circuit is ready for use.

In some embodiments, the method may include trimming 1230 the reservoir from the substrate, as well as a step of applying 1235 a protective film layer on to the capillary trace circuit that covers the plurality of conductive traces.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments. It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

What is claimed is:

1. A method for manufacturing a capillary trace circuit, the method comprising:
   obtaining a substrate, the substrate having a reservoir for receiving a conductive ink and a plurality of trace voids that are arranged in a pattern, the plurality of trace voids each having a path of fluid connection to the reservoir;
   filling the reservoir with the conductive ink;
   placing a cover film over the plurality of trace voids;
   allowing the conductive ink to fill the plurality of trace voids via capillary action to create a plurality of conductive traces;
   allowing the conductive ink in the plurality of conductive traces to dry; and
   trimming the reservoir from the substrate.

2. The method according to claim 1, wherein the substrate comprises one or more pad voids that are in fluid communication with at least a portion of the plurality of trace voids and the reservoir, wherein the cover film extends over the one or more pad voids.

3. The method according to claim 2, wherein filling the reservoir with the conductive ink comprises filling the reservoir with an amount of conductive ink that is sufficient to fill both the plurality of trace voids and the one or more pad voids so as to form one or more conductive pads in addition to the plurality of conductive traces.

4. The method according to claim 3, wherein the substrate comprises one or more optional channel voids that are in fluid communication with the one or more pad voids and the reservoir.

5. The method according to claim 4, wherein an aspect ratio of each of the one or more pad voids creates one or more filled pads each having a height that is larger than its width.

6. The method according to claim 5, wherein the aspect ratio between the height and the width is greater than approximately 3:1.

7. The method according to claim 1, wherein an aspect ratio of each of the plurality of trace voids creates a plurality of conductive traces each having a height that is larger than its width.

8. The method according to claim 1, further comprising stacking two capillary trace circuits on top of one another such that the plurality of conductive traces of a first of the two capillary trace circuits are disposed orthogonally to the plurality of conductive traces of a second of the two capillary trace circuits.

9. The method according to claim 1, further comprising stacking two capillary trace circuits on top of one another such that the plurality of conductive traces of a first of the two capillary trace circuits are disposed orthogonally to the plurality of conductive traces of a second of the two capillary trace circuits, wherein the plurality of conductive traces of the first and second capillary trace circuits are placed in face-to-face relationship to one another.

10. The method according to claim 9, further comprising placing a transparent film layer between the first and second capillary trace circuits.

11. The method according to claim 1, further comprising applying a protective film layer on to the capillary trace circuit that covers the plurality of conductive traces, wherein the protective film layer includes any of a semi-transparent coating of tin-doped indium oxide (ITO), copper nanowires, silver nanowires, and combinations thereof.

12. The method according to claim 1, further comprising attaching a flex circuit interface to each of the plurality of conductive traces.

13. The method according to claim 1, further comprising applying a pressure force to the conductive ink so as to force the conductive ink into the plurality of trace voids.

14. The method according to claim 1, further comprising applying a layer of electroplating to a top surface of each of the plurality of conductive traces to increase a height of each of the plurality of conductive traces.

15. The method according to claim 1, wherein the substrate is comprised of any of a plastic or a semi-conducting material.

16. The method according to claim 1, wherein the substrate is a transparent plastic.

17. The method according to claim 1, wherein the plurality of conductive traces are electrically coupled via a bus trace that is filled with the conductive ink.

18. The method according to claim 1, wherein the plurality of conductive traces are created on the substrate by any of embossing, ultraviolet curing, ink-jet printing, silk-screening, vacuum deposition, or combinations thereof, of material onto a film to form the substrate.

19. A circuit, comprising: a substrate having a plurality of trace voids that are arranged in a pattern, each of the plurality of trace voids having a high aspect height to width ratio of greater than 3:1; and a plurality of pad voids joined to the plurality of trace voids, wherein the plurality of trace voids are filled with a conductive ink via capillary action to form a plurality of conductive traces, wherein a flex circuit interface is attached to each of the plurality of conductive traces.

20. A method for manufacturing a capillary trace circuit, the method comprising:
obtaining a substrate, the substrate having a reservoir for receiving a conductive ink and a plurality of trace voids that are arranged in a pattern, the plurality of trace voids each having a path of fluid connection to the reservoir;
filling the reservoir with the conductive ink;
placing a cover film over the plurality of trace voids;
allowing the conductive ink to fill the plurality of trace voids via capillary action to create a plurality of conductive traces;
allowing the conductive ink in the plurality of conductive traces to dry; and
attaching a flex circuit interface to each of the plurality of conductive traces.

21. The method according to claim 20, wherein the substrate comprises one or more pad voids that are in fluid communication with at least a portion of the plurality of trace voids and the reservoir, wherein the cover film extends over the one or more pad voids.

22. The method according to claim 21, wherein filling the reservoir with the conductive ink comprises filling the reservoir with an amount of conductive ink that is sufficient to fill both the plurality of trace voids and the one or more pad voids so as to form one or more conductive pads in addition to the plurality of conductive traces.

23. The method according to claim 22, wherein the substrate comprises one or more optional channel voids that are in fluid communication with the one or more pad voids and the reservoir.

24. The method according to claim 23, wherein an aspect ratio of each of the one or more pad voids creates one or more filled pads each having a height that is larger than its width.

25. The method according to claim 24, wherein the aspect ratio between the height and the width is greater than approximately 3:1.

26. The method according to claim 20, further comprising trimming the reservoir from the substrate.

27. The method according to claim 20, wherein an aspect ratio of each of the plurality of trace voids creates a plurality of conductive traces each having a height that is larger than its width.

28. The method according to claim 20, further comprising stacking two capillary trace circuits on top of one another such that the plurality of conductive traces of a first of the two capillary trace circuits are disposed orthogonally to the plurality of conductive traces of a second of the two capillary trace circuits.

29. The method according to claim 20, further comprising stacking two capillary trace circuits on top of one another such that the plurality of conductive traces of a first of the two capillary trace circuits are disposed orthogonally to the plurality of conductive traces of a second of the two capillary trace circuits, wherein the plurality of conductive traces of the first and second capillary trace circuits are placed in face-to-face relationship to one another.

30. The method according to claim 29, further comprising placing a transparent film layer between the first and second capillary trace circuits.

31. The method according to claim 20, further comprising applying a protective film layer on to the capillary trace circuit that covers the plurality of conductive traces, wherein the protective film layer includes any of a semi-transparent coating of tin-doped indium oxide (ITO), copper nanowires, silver nanowires, and combinations thereof.

32. The method according to claim 20, further comprising applying a pressure force to the conductive ink so as to force the conductive ink into the plurality of trace voids.

33. The method according to claim 20, further comprising applying a layer of electroplating to a top surface of each of the plurality of conductive traces to increase a height of each of the plurality of conductive traces.

34. The method according to claim 20, wherein the substrate is comprised of any of a plastic or a semiconducting material.

35. The method according to claim 20, wherein the substrate is a transparent plastic.

36. The method according to claim 20, wherein the plurality of conductive traces are electrically coupled via a bus trace that is filled with the conductive ink.

37. The method according to claim 20, wherein the plurality of conductive traces are created on the substrate by any of embossing, ultraviolet curing, ink-jet printing, silk-screening, vacuum deposition, or combinations thereof, of material onto a film to form the substrate.

38. A method for manufacturing a capillary trace circuit, the method comprising:
   obtaining a substrate, the substrate having a reservoir for receiving a conductive ink and a plurality of trace voids that are arranged in a pattern, the plurality of trace voids each having a path of fluid connection to the reservoir;
   filling the reservoir with the conductive ink;
   placing a cover film over the plurality of trace voids;
   allowing the conductive ink to fill the plurality of trace voids via capillary action to create a plurality of conductive traces;
   applying a pressure force to the conductive ink so as to force the conductive ink into the plurality of trace voids; and
   allowing the conductive ink in the plurality of conductive traces to dry.

39. The method according to claim 38, wherein the substrate comprises one or more pad voids that are in fluid communication with at least a portion of the plurality of trace voids and the reservoir, wherein the cover film extends over the one or more pad voids.

40. The method according to claim 38, wherein filling the reservoir with the conductive ink comprises filling the reservoir with an amount of conductive ink that is sufficient to fill both the plurality of trace voids and the one or more pad voids so as to form one or more conductive pads in addition to the plurality of conductive traces.

41. The method according to claim 40, wherein the substrate comprises one or more optional channel voids that are in fluid communication with the one or more pad voids and the reservoir.

42. The method according to claim 41, wherein an aspect ratio of each of the one or more pad voids creates one or more filled pads each having a height that is larger than its width.

43. The method according to claim 42, wherein the aspect ratio between the height and the width is greater than approximately 3:1.

44. The method according to claim 38, further comprising trimming the reservoir from the substrate.

45. The method according to claim 38, wherein an aspect ratio of each of the plurality of trace voids creates a plurality of conductive traces each having a height that is larger than its width.

46. The method according to claim 38, further comprising stacking two capillary trace circuits on top of one another such that the plurality of conductive traces of a first of the two capillary trace circuits are disposed orthogonally to the plurality of conductive traces of a second of the two capillary trace circuits.

47. The method according to claim 38, further comprising stacking two capillary trace circuits on top of one another such that the plurality of conductive traces of a first of the two capillary trace circuits are disposed orthogonally to the plurality of conductive traces of a second of the two capillary trace circuits, wherein the plurality of conductive traces of the first and second capillary trace circuits are placed in face-to-face relationship to one another.

48. The method according to claim 47, further comprising placing a transparent film layer between the first and second capillary trace circuits.

49. The method according to claim 38, further comprising applying a protective film layer on to the capillary trace circuit that covers the plurality of conductive traces, wherein the protective film layer includes any of a semi-transparent coating of tin-doped indium oxide (ITO), copper nanowires, silver nanowires, and combinations thereof.

50. The method according to claim 38, further comprising attaching a flex circuit interface to each of the plurality of conductive traces.

51. The method according to claim 38, further comprising applying a layer of electroplating to a top surface of each of the plurality of conductive traces to increase a height of each of the plurality of conductive traces.

52. The method according to claim 38, wherein the substrate is comprised of any of a plastic or a semiconducting material.

53. The method according to claim 38, wherein the substrate is a transparent plastic.

54. The method according to claim 38, wherein the plurality of conductive traces are electrically coupled via a bus trace that is filled with the conductive ink.

55. The method according to claim 38, wherein the plurality of conductive traces are created on the substrate by any of embossing, ultraviolet curing, ink-jet printing, silk-screening, vacuum deposition, or combinations thereof, of material onto a film to form the substrate.

* * * * *